(12) United States Patent
Ishida (10) Patent No.: US 10,823,767 B1
(45) Date of Patent: Nov. 3, 2020

(54) COMPARATOR SYSTEM HAVING INTERNAL INPUT OFFSET VOLTAGE

(71) Applicant: SEMICONDUCTOR COMPONENTS INDUSTRIES, LLC, Phoenix, AZ (US)

(72) Inventor: Manabu Ishida, Miyagi-ken (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/502,379

(22) Filed: Jul. 3, 2019

Related U.S. Application Data

(60) Provisional application No. 62/852,437, filed on May 24, 2019.

(51) Int. Cl.
*H03K 5/153* (2006.01)
*G01R 19/165* (2006.01)
*H03K 5/1252* (2006.01)
*H03K 5/24* (2006.01)

(52) U.S. Cl.
CPC ..... *G01R 19/16519* (2013.01); *H03K 5/1252* (2013.01); *H03K 5/2481* (2013.01)

(58) Field of Classification Search
CPC ........ H03K 5/2481; H03K 5/249; H03K 5/08; H03K 5/153; H03K 5/1534; H03K 5/1536; H03K 5/003; H03K 17/30; G01R 19/175; G01R 19/16519; G01R 19/0038; H03F 3/45475; H03F 3/45183
See application file for complete search history.

(56) References Cited

U.S. PATENT DOCUMENTS

| | | | |
|---|---|---|---|
| 10,250,198 B2 * | 4/2019 | Motoroiu | ............. H03G 1/0088 |
| 10,439,559 B2 * | 10/2019 | Motoroiu | ............ H03F 3/45183 |
| 2003/0214351 A1 | 11/2003 | Nandy et al. | |
| 2005/0050861 A1 | 3/2005 | Suolahti | |

* cited by examiner

*Primary Examiner* — Long Nguyen
(74) *Attorney, Agent, or Firm* — Adam R. Stephenson, Ltd.

(57) ABSTRACT

Implementations of a comparator system may include a first transistor including a gate where the gate is configured to be coupled to a resistor-capacitor (RC) noise filter coupled to a resistor. The first transistor may be included in a PMOS differential pair. A first offset resistor may be coupled to the source of the first transistor and to a source of a second transistor included in the PMOS differential pair. A second offset resistor may be coupled between the first transistor and the second transistor. A voltage difference between a first back gate bias voltage of the first transistor and a second back gate bias voltage of the second transistor may indicate a current value through the resistor.

10 Claims, 6 Drawing Sheets

COMPARATOR SYSTEM HAVING INTERNAL INPUT OFFSET VOLTAGE

CROSS REFERENCE TO RELATED APPLICATIONS

This application claims the benefit of the filing date of U.S. Provisional Patent Application 62/852,437, entitled "COMPARATOR SYSTEM HAVING INTERNAL INPUT OFFSET VOLTAGE" to Ishida, which was filed on May 24, 2019, the disclosure of which is hereby incorporated entirely herein by reference.

BACKGROUND

1. Technical Field

Aspects of this document relate generally to semiconductor voltage comparators.

2. Background

Voltage comparators generally include a system for the detection of negative current. To this end, they include a positive reference voltage and a resistor to generate an input offset voltage to set a specific negative voltage value, which may then be detected. If a RC noise filter is used, the current generating the input offset may create an offset voltage on the input terminal of the voltage comparator.

SUMMARY

Implementations of a comparator system having internal input offset voltage may include: a transistor having a gate, where the gate may be configured to be coupled to a resistor-capacitor (RC) noise filter that may be coupled to a resistor. The transistor may be included within a first cascode device coupled with a second cascode device. A first offset resistor may be coupled to a source of the first cascode device and a source of the second cascode device, and a second offset resistor may be coupled between the first cascode device and the second cascode device. A first back gate bias voltage of the first cascode device and a second back gate bias voltage of the second cascode device may indicate a current value through the resistor.

Implementations of a comparator system having internal input offset voltage may include one, all, or any of the following:

The first offset resistor may be configured to generate an input offset voltage.

No current source may be directly used to generate the input offset voltage.

The comparator may include four additional transistors operatively coupled together.

The comparator may include a common ground coupled with the first cascode device and the second cascode device.

There may be no offset voltage resulting from the RC noise filter.

Implementations of a comparator system having internal input offset voltage may include: a transistor having a gate, where the gate may be configured to be coupled to a resistor-capacitor (RC) noise filter that may be coupled to a resistor. The transistor may be included in a first cascode device coupled with a second cascode device. A first offset resistor may be coupled to a source of the first cascode device and a source of the second cascode device, and a second offset resistor may be coupled between the first cascode device and the second cascode device. One or more switches may be coupled between the first cascode device and the second cascode device, and one or more switches may be coupled between the second offset resistor and the first cascode device.

Implementations of a comparator system having internal input offset voltage may include one, all, or any of the following:

A resistance of the first offset resistor may be changed using one or more switches.

The resistance of the second offset resistor may be changed to equal the resistance of the first offset resistor using one or more switches.

The comparator may include two additional transistors operatively coupled together.

The comparator may include a common ground coupled with the first cascode device and the second cascode device.

The first offset resistor may be configured to generate an input offset voltage.

There may be no offset voltage resulting from the RC noise filter.

Implementations of a comparator system having internal input offset voltage may include: a transistor having a gate, where the gate may be configured to be coupled to a resistor-capacitor (RC) noise filter that may be coupled to a resistor. The transistor may be included in a first cascode device coupled with a second cascode device. An offset resistor may be coupled between the first cascode device and the second cascode device. A first back gate bias voltage of the first cascode device and a second back gate bias voltage of the second cascode device may indicate a current value through the resistor.

Implementations of a comparator system having internal input offset voltage may include one, all, or any of the following:

A first back gate and a second back gate may be coupled to a common ground.

No current source may be directly used to generate the input offset voltage.

There may be no offset voltage resulting from the RC noise filter.

The comparator may include six additional transistors operatively coupled together.

The first cascode device and the second cascode device may each include a PMOS transistor.

The first cascode device and the second cascode device may each include a PMOS transistor differential pair.

Implementations of a comparator system may include a first transistor including a gate where the gate is configured to be coupled to a resistor-capacitor (RC) noise filter coupled to a resistor. The first transistor may be included in a PMOS differential pair. A first offset resistor may be coupled to the source of the first transistor and to a source of a second transistor included in the PMOS differential pair. A second offset resistor may be coupled between the first transistor and the second transistor. A voltage difference between a first back gate bias voltage of the first transistor and a second back gate bias voltage of the second transistor may indicate a current value through the resistor.

Implementations of a comparator system may include one, all, or any of the following:

The first offset resistor may be configured to generate an input offset voltage.

No current source may be directly used to generate the input offset voltage.

Four additional transistors operatively coupled together may be included.

A common ground coupled with the PMOS differential pair may be included.

In various implementations, no offset voltage may result from the RC noise filter.

Implementations of a comparator system may include a transistor having a gate configured to be coupled to an RC noise filter coupled with a resistor. The transistor may be included in a first cascode device coupled with a second cascode device. The first offset resistor may be coupled to a source of the first cascode device and a source of the second cascode device. A second offset resistor may be coupled between the cascode tail current source of the first cascode device and the second cascode device. A first one or more switches may be coupled between the first cascode device and the second cascode device. A second one or more switches may be coupled between the second offset resistor and the first cascode device.

Implementations of a comparator system may include one, all, or any of the following:

A resistance of the first offset resistor may be changed using the first one or more switches.

A resistance of the second offset resistor may be changed to equal the resistance of the first offset resistor using the second one or more switches.

Two or more additional transistors may be included which are operatively coupled together.

A common ground may be coupled with the first cascode device and the second cascode device.

The first offset resistor may be configured to generate an input offset voltage.

In various implementations, no offset voltage may result from the RC noise filter.

Implementations of a comparator system may include a first transistor including a gate configured to be coupled to an RC noise filter coupled to a resistor. The first transistor may be included in a PMOS differential pair. An NMOS current mirror may be included and coupled to the PMOS differential pair. A first offset resistor may be coupled to the source of the first transistor and to a source of a second transistor of the PMOS differential pair. A second offset resistor may be coupled between the first transistor and the second transistor. A voltage difference between a first back gate bias voltage of the first transistor and a second back gate bias voltage of the second transistor indicates a current value through the resistor.

Implementations of a comparator system may include one, all, or any of the following:

The first offset resistor may be configured to generate an input offset voltage.

No current source may be directly used to generate the input offset voltage.

A first back gate and a second back gate may be coupled to a common ground.

In various implementations, there may be no offset voltage resulting from the RC noise filter.

Six additional transistors may be included which are operatively coupled together.

The PMOS differential pair may include a first cascode device where the first cascode device includes a PMOS transistor.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended comparator system having internal input offset voltage will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such comparator system having internal input offset voltage, and implementing components and methods, consistent with the intended operation and methods.

Figure 1:
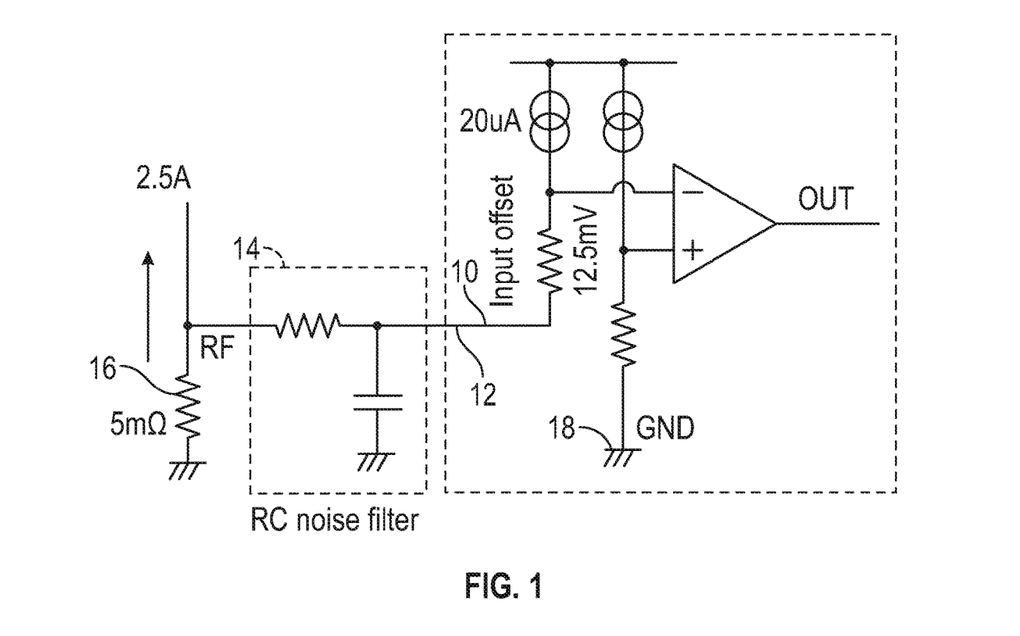
FIG. 1 illustrates a circuit diagram of an implementation of a system for negative current detection.

Referring to FIG. 1, a circuit diagram of an implementation of a system for negative current detection is illustrated. As illustrated, the system includes an input 10 connected at the negative input of a comparator. In various implementations, the input 10 may be configured to couple to a resistor-capacitor (RC) noise filter 14 at output 12. As illustrated, the RC noise filter 14 may be coupled to a resistor 16. Also, as illustrated, the system may include a common ground 18. In various implementations, the system may include a positive reference voltage which, along with a resistor, may generate an input offset voltage that may be used to detect a negative voltage. In the system illustrated in FIG. 1, the resistor between the input 10 and the 10 micro Amp current source generates the input offset voltage. In this system, when the RC noise filter 14 is utilized, a current that generates the input offset voltage may create an unwanted offset voltage for an input terminal to the comparator on the negative input. Because of this, the system illustrated in FIG. 1 requires various design iterations to be performed in order to include appropriate components with the needed electrical parameters to compensate for the unwanted offset voltage from the RC noise filter 14. This in turn increases design time resources and can negatively affect the accuracy of the detection of the circuit.

Figure 2:
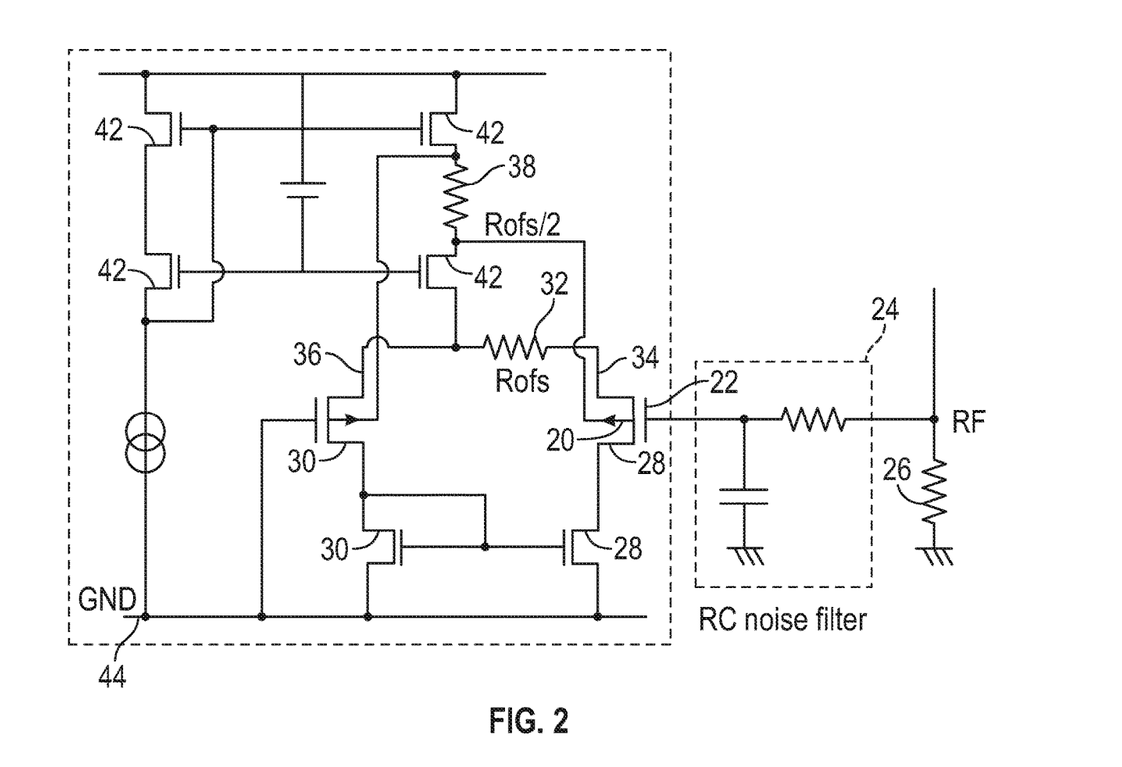
FIG. 2 illustrates a circuit diagram of an implementation of a comparator system having internal input offset voltage with two offset resistors.

The system implementations disclosed herein are various circuit designs that may utilize hardware to eliminate or diminish the unwanted offset voltage, or threshold offset. Referring now to FIG. 2, a circuit diagram of an implementation of a comparator system having internal input offset voltage with two offset resistors is illustrated. As illustrated, the system includes a transistor 20 that has gate 22. In various implementations, by non-limiting example, the gate 22 may be configured to couple to a resistor-capacitor (RC) noise filter 24. In various implementations, the RC noise filter is used to ensure that the input to the comparator system is free from voltage/current fluctuations from the feed line that feeds resistor 26. In various implementations, the RC noise filter 24 may be coupled to resistor 26. As illustrated, the transistor 20 is included within a first cascode device 28 which is coupled to a second cascode device 30. The first cascode device 28 contains PMOS transistor (as illustrated in FIG. 2), and the second cascode device 30 contains a corresponding PMOS transistor, forming a differential pair. The first cascode device 28 also includes an NMOS transistor as does the second cascode device 30 and the combined NMOS devices form an active-load. In various implementations, the cascodes are used as two-stage amplifiers each having an amplifier and a current buffer. Cascodes formed with semiconductor materials often include two transistors, such as bipolar junction transistors (BJTs) and/or field effect transistors (FETs). One transistor generally operates as a common source or common emitter and the other transistor generally operates as a common gate or common base. In various implementations, the usage of two coupled cascode devices may allow for the comparator to make self-tuning or automatic adjustments, where no manual adjustments would need to be made. In this way, the ability of the comparator system to detect a negative voltage/current does not have to be corrected using hardware devices with parameters found using iterative design processes, as the two cascode devices may together produce a desired input voltage even when an RC noise filter is being used, as the RC filter will not generate an unwanted DC voltage across its resistor portion anymore. In those implementations, if the offset resistor 32 is connected between transistor 42 and PMOS transistor 30 (on the left side of the node adjacent to offset resistor 32) the system will be able to detect positive voltage.

Still referring to FIG. 2, a first offset resistor 32 is coupled to a source of the first cascode device 34, as well as to a source of the second cascode device 36, as illustrated. In various implementations, the first offset resistor 32 may be coupled with the source of the first cascode device 34 in order to generate an internal input offset voltage. As illustrated, a second offset resistor 38 is coupled between the first cascode device 28 and the second cascode device 30. In various implementations, the second offset resistor 38 may have half of the resistance of the first offset resistor 32. In various implementations, a first back gate bias voltage of the first cascode device 28 and a second back gate bias voltage of the second cascode device 30 may indicate the value of the voltage difference across the resistor 26. In various implementations, by non-limiting example, the first offset resistor 32 may be configured to generate an input offset voltage. In various implementations, no current source is needed to generate the input offset voltage.

As illustrated, the comparator system may include four additional transistors 42 operatively coupled together. In various implementations, two of the four transistors may be coupled to either end of the second offset resistor 38. Put differently, the second resistor 38 may be inserted between the two transistors 42 constituting the cascade tail-current source. Also, the comparator system includes include a common ground 44, which may be coupled to a current source. In various implementations, the common ground 44 may be coupled also with the first cascode device 28 and the second cascode device 30.

Figure 3:
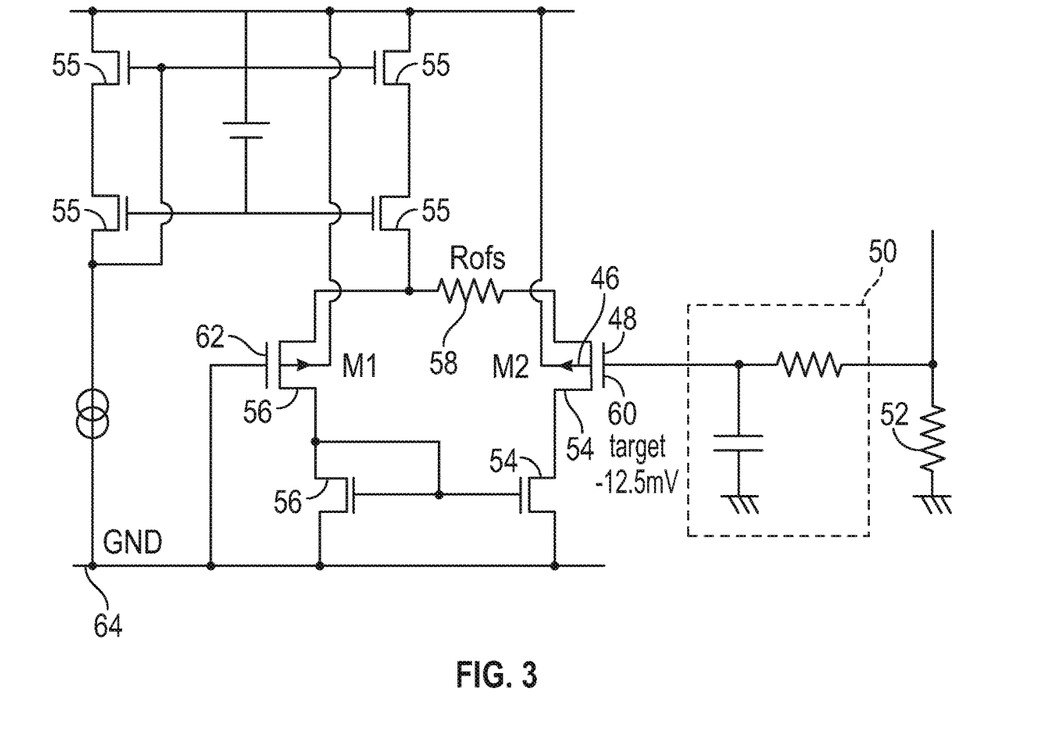
FIG. 3 illustrates a circuit diagram of an implementation of a comparator system having internal input offset voltage with one offset resistor.

Referring to FIG. 3, a circuit diagram of an implementation of a comparator system having an internal input offset voltage with one offset resistor is illustrated. As illustrated, a transistor 46 includes a gate 48. In various implementations, the gate 48 may be coupled with a RC noise filter 50. As illustrated, the RC noise filter 50 is coupled to a resistor 52 used to detect negative voltage. As illustrated, the transistor 46 is included within a first cascode device 54 that is coupled with a second cascode device 56. As illustrated, an offset resistor 58 is coupled between the first cascode device 54 and the second cascode device 56. In various implementations, the offset resistor 58 may be coupled to transistors 55, as illustrated. In various implementations, a first back gate bias voltage of the first cascode device 54 and a second back gate bias voltage of the second cascode device 56 are used, in combination with the offset resistor 58 to detect the voltage drop/current across the resistor 52. As illustrated, a first back gate 46 and a second back gate are coupled to a power supply. In various implementations, there is no current source that is directly used to generate the input offset voltage. In various implementations, there is no offset voltage that results from the use of the RC noise filter as there is no longer any DC current flowing through the resistor included in the RC filter 50.

Figure 4:
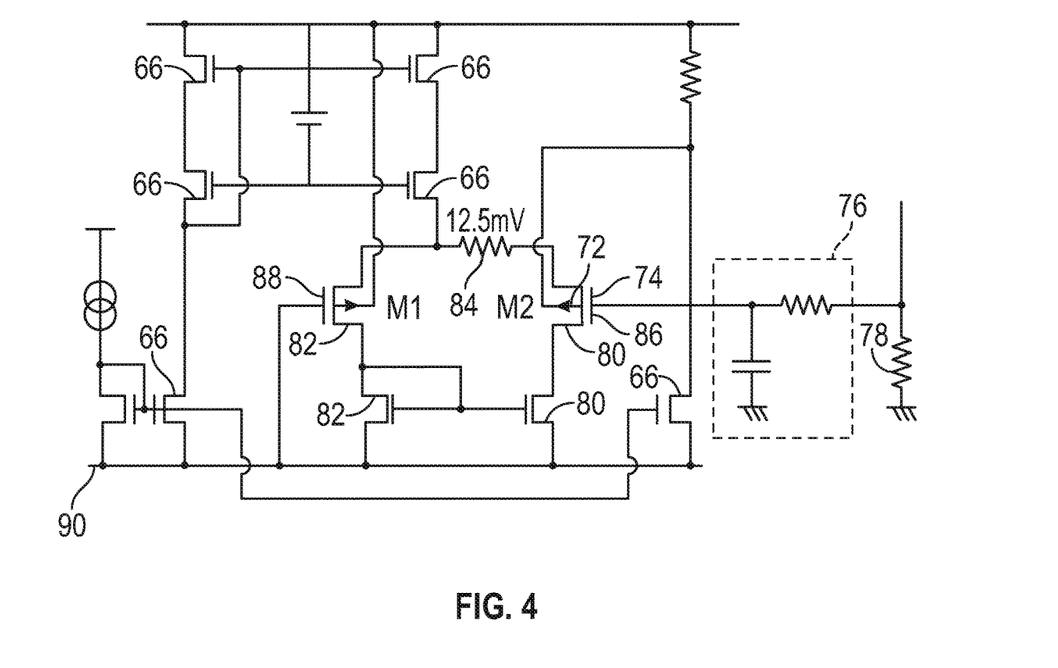
FIG. 4 illustrates an alternative view of a circuit diagram of an implementation of a comparator system having internal input offset voltage with one offset resistor.

Still referring to FIG. 3, the first cascode device 54 and the second cascode device 56 may each include a PMOS transistor. In various implementations, the first cascode device 54 and the second cascode device 56 may form a PMOS transistor differential pair. In various implementations, for the cascode devices to detect an input voltage near 0 V, the back gate bias effect may be used to cause the PMOS transistor to operate in a saturation region. In this way, an absolute value of the PMOS threshold voltage may need to be increased by boosting the back gate voltage by connecting both the first back gate 46 and the second back gate to the power supply. In various implementations the absolute values of the threshold voltages between M1 and M2 should be equal. To match the threshold voltage of M2 with that of M1, the back gate voltage of M2 may need to be decreased by the same voltage value across the offset resistor 84, as also shown in FIG. 4. The back gate voltage of M2 may also be decreased by placing a resistor between the cascode devices, as illustrated in FIG. 5.

Referring now to FIG. 4, an alternative view of circuit diagram of another implementation of a comparator system having internal input offset voltage with one offset resistor is illustrated. As illustrated, transistor 72 includes a gate 74. As in the other various implementations, the gate 74 is coupled to a RC noise filter 76 coupled to a resistor 78. As illustrated, the transistor 72 is included within a first cascode device 80 that is coupled with a second cascode device 82. As illustrated, an offset resistor 84 is coupled between the first cascode device 80 and the second cascode device 82. In various implementations, the offset resistor 84 may be coupled with additional transistors 66, as illustrated. In various implementations, a difference between a first back gate bias voltage of the first cascode device 80 and a second back gate bias voltage of the second cascode device 82 may indicate a value of the voltage across the resistor 78 at the time of detection. Also, a first back gate 72 and a second back gate 88 are coupled to a supply voltage 90. In various implementations, there may be no specific current source used to specifically generate the input offset voltage (like in the system illustrated in FIG. 1). Because of the use of the first cascode device 80, the second cascode device 82, and the offset resistor 84, in various implementations, there is no offset voltage that results from the use of the RC noise filter 76. As illustrated, the comparator system may include six additional transistors 66 that may be operatively coupled together. In various implementations, the first cascode device 80 and the second cascode device 82 may each include a PMOS transistor. In such implementations, the first cascode device 80 and the second cascode device 82 form a PMOS transistor differential pair, as illustrated.

Figure 5:
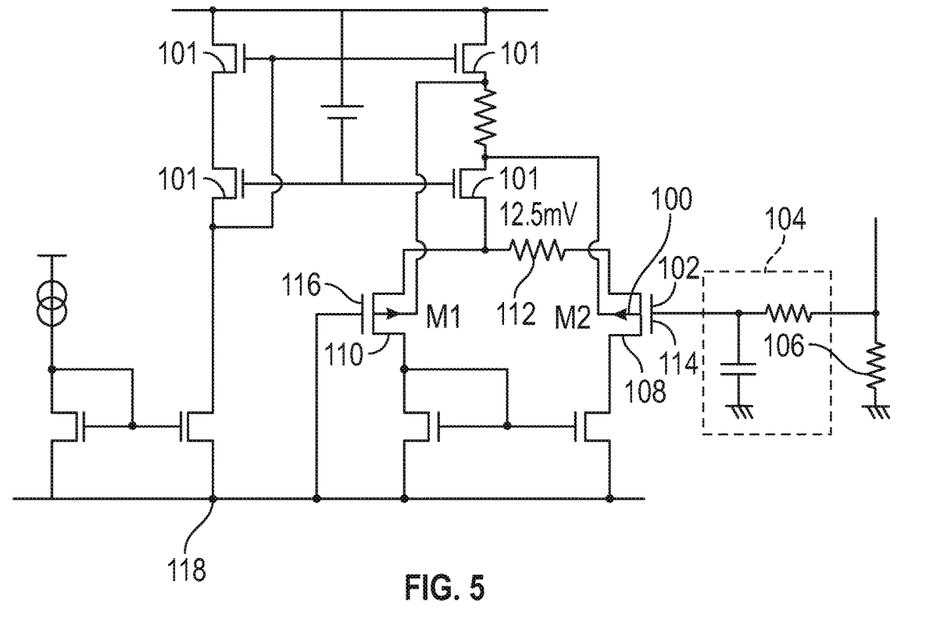
FIG. 5 illustrates a circuit diagram of an implementation of a comparator system having internal input offset voltage with two additional transistors.

Referring to FIG. 5, a circuit diagram of an implementation of a comparator system having internal input offset voltage with transistors 101 that form a tail current source is illustrated. As illustrated, a resistor is placed between the two transistors 101 to form the tail current source. As illustrated, transistor 100 includes a gate 102 coupled with RC noise filter 104. As illustrated, the RC noise filter 104 is coupled to a resistor 106 used to detect negative (or positive) voltage/current. As illustrated, the transistor 100 is included within a first cascode device 108 that is coupled with a second cascode device 110. As illustrated, an offset resistor 112 is coupled between the first cascode device 108 and the second cascode device 110. In various implementations, the comparator system may also include an additional offset resistor. In various implementations, a first back gate bias voltage of the first cascode device 108 and a second back gate bias voltage of the second cascode device 110 may be used to detect whether a voltage drop across the resistor 106 is positive or negative. A second offset resistor may be inserted between the cascade transistors forming the tail current source in order to provide appropriate back gate bias voltages for the differential pair. As illustrated, a first back gate 114 and a second back gate 116 are coupled on either side of the offset resistor (second offset resistor) 112. In various implementations, there may be no specific current source that is used to generate the input offset voltage as in the system illustrated in FIG. 1. In various implementations, the first cascode device 108 and the second cascode device 110 may each include a PMOS transistor. In such implementations, the first cascode device 108 and the second cascode device 110 form a PMOS transistor differential pair.

Figure 6:
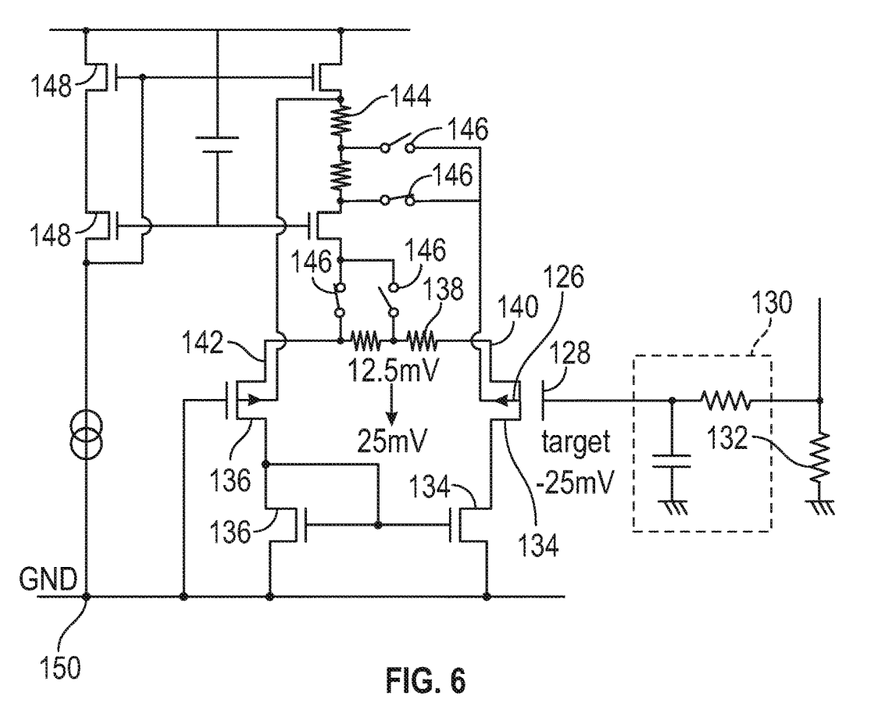
FIG. 6 illustrates a circuit diagram of an implementation of a comparator system having internal input offset voltage with one or more switches.

Referring to FIG. 6, a circuit diagram of an implementation of a comparator system having internal input offset voltage with various switches is illustrated. As illustrated, transistor 126 includes a gate 128 coupled with an RC noise filter 130. As illustrated, the RC noise filter 130 is coupled to a resistor 132 used to detect negative (or positive) voltage. As illustrated, the transistor 126 is included in a first cascode device 134 coupled with a second cascode device 136. As in the other various implementations disclosed in this document, a first offset resistor 138 in the form of a pair of resistors in series is coupled between a source of the first cascode device 140 and a source of the second cascode device 142. A second offset resistor 144 in the form of a pair of resistors in series is also coupled between the first cascode device 134 and the second cascode device 136. The second offset resistor 144 is be inserted between the transistors of the cascode devices, which collectively form the tail current source. In various implementations, additional resistors in series may be coupled with the first offset resistor or the second offset resistor.

Still referring to FIG. 6, two switches 146 are coupled between the first cascode device 134 and the second cascode device 136, and between the pair of resistors in series of the second offset resistor 144 and the first cascode device 134. In various implementations, the resistance of the first offset resistor is changed using the switches 146 as the closing of the switch allows one of the paired resistors to be placed in the path of current flow in the circuit, thus changing the resistance. In various implementations, the resistance value of the second offset resistor 144 that is applied between the first cascode device 134 and the second cascode device 136 may be changed using the switches 146 which determine which paired resistors receive current flow. In various implementations, if the resistance value is increased, one or more of the switches 146 may be utilized to bring the resistance value between the first cascode device 140 and the second cascode device 136 to the same value. By adjusting the resistances, the back gate voltage may also be adjusted. For example, when the resistance of the first offset resistor and the second offset resistor are summed between the first cascode device 134 and the second cascode device 136, the back gate voltage decreases accordingly. As illustrated, the comparator may include two additional transistors 148, which are operatively coupled together. As illustrated, a common ground 150 is coupled with the first cascode device 134 and the second cascode device 136 and to the supply voltage. In various implementations, the comparator system is used to generate an input offset voltage for use in detecting a negative voltage (or positive voltage).

Figure 7:
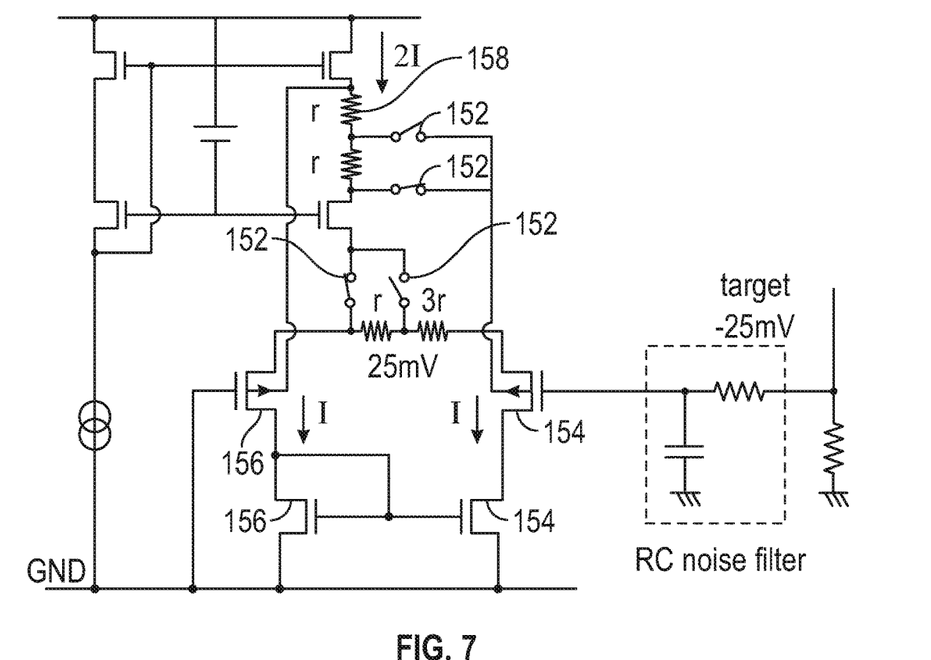
FIG. 7 illustrates a circuit diagram of an implementation of a comparator system having internal input offset voltage with one or more switches, showing voltage reduction.

Referring to FIG. 7, a circuit diagram of an implementation of a comparator system having internal input offset voltage with one or more switches, showing voltage reduction, is illustrated. Similarly to FIG. 6, two switches 152 are coupled between the first cascode device 154 and the second cascode device 156, and between the pair of resistors in series of the second offset resistor 158 and the first cascode device 154. In various implementations, the resistance value of the first offset resistor 158 is changed using the switches 152 as the closing of the switch allows one of the paired resistors to be placed in the path of current flow in the circuit, thus changing the resistance. In various implementations, the voltage through the offset resistor 158 can be calculated by: $r=6.25$ k$\Omega$, $I=10$ µA, $(r+r) \times 2I = 4rI$, $4r \times I = 4rI$, $4rI = 2.5$ k$\Omega \times 10$ µA$=25$ mV. In this case, the switches are used to adjust the offset resistance value experienced between the first cascode device 154 and the second cascode device 156 according to the desired back gate voltage (which corresponds to the voltage across the offset 158).

Figure 8:
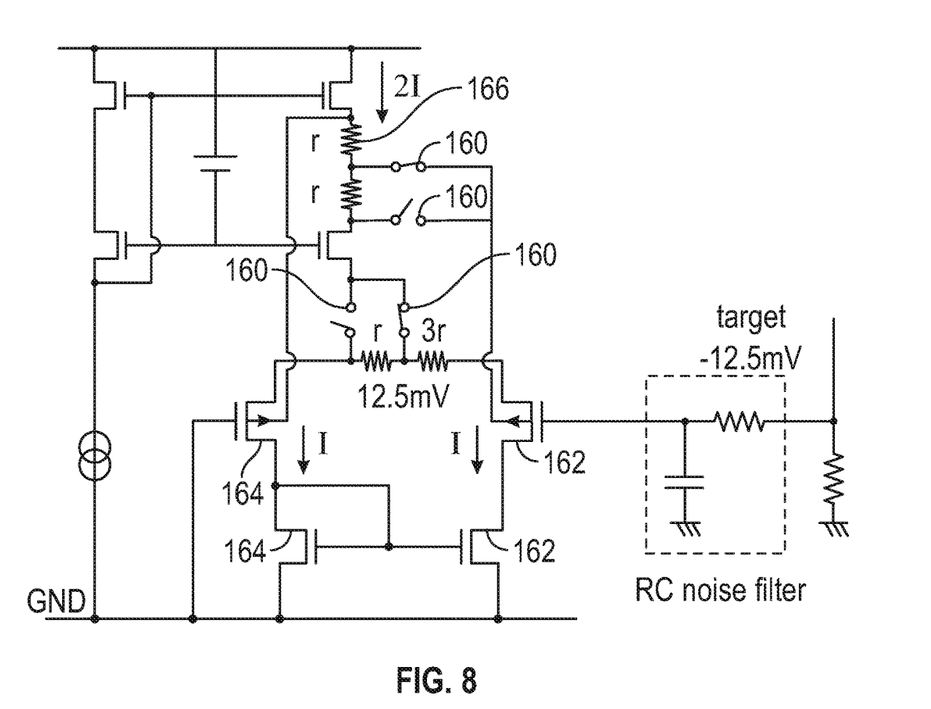
FIG. 8 illustrates a circuit diagram of an implementation of a comparator system having internal input offset voltage with one or more switches, showing alternative switches open.

Referring to FIG. 8, a circuit diagram of an implementation of a comparator system having internal input offset voltage with one or more switches, showing alternative switches open, is illustrated. Similar to FIG. 6, two switches 160 are coupled between the first cascode device 162 and the second cascode device 164, and between the pair of resistors in series of the second offset resistor 166 and the first cascode device 162. In various implementations, the resistance of the first offset resistor 166 is changed using the switches 160 as the closing of the switch allows one of the paired resistors to be placed in the path of current flow in the circuit, thus changing the resistance value between the first cascode device 162 and second cascode device 164. In various implementations, the voltage across the offset resistor 160 can be calculated by: $r \times 2I = 2rI$, $3r \times I - r \times I = 2rI$, 2rI=12.5 mV. In such implementations, as the resistance value of the offset resistors are adjusted, the back gate voltage is correspondingly adjusted.

Figure 9:
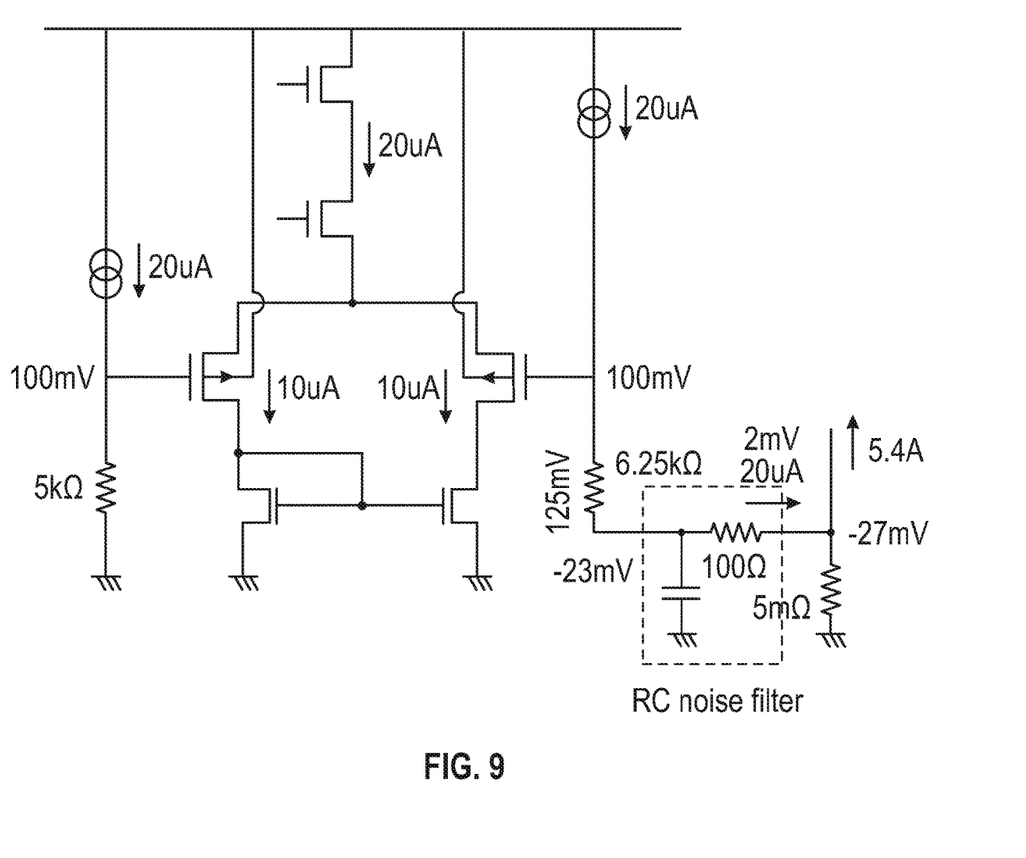
FIG. 9 illustrates a circuit diagram of an implementation of a comparator system having internal input offset voltage with an offset voltage across the resistor of the RC noise filter of 2 mV and a detected current of 5.4 A.

Referring to FIG. 9, a circuit diagram of an implementation of a comparator system having external input offset voltage that detects a voltage of 5 amps across the resistor coupled to the RC noise filter is illustrated. This implementation demonstrates how the presence of the RC noise filter in this system implementation results in an unwanted offset voltage of 2 mV because an external offset resistor is used. In such implementations, the differential pair ideally balances when the reverse current value is 5 amps. However, the threshold slightly shifts because of the presence of the RC filter. As a result, the detected value of the current is 5.4 amps, which does not actually reflect the desired current.

Figure 10:
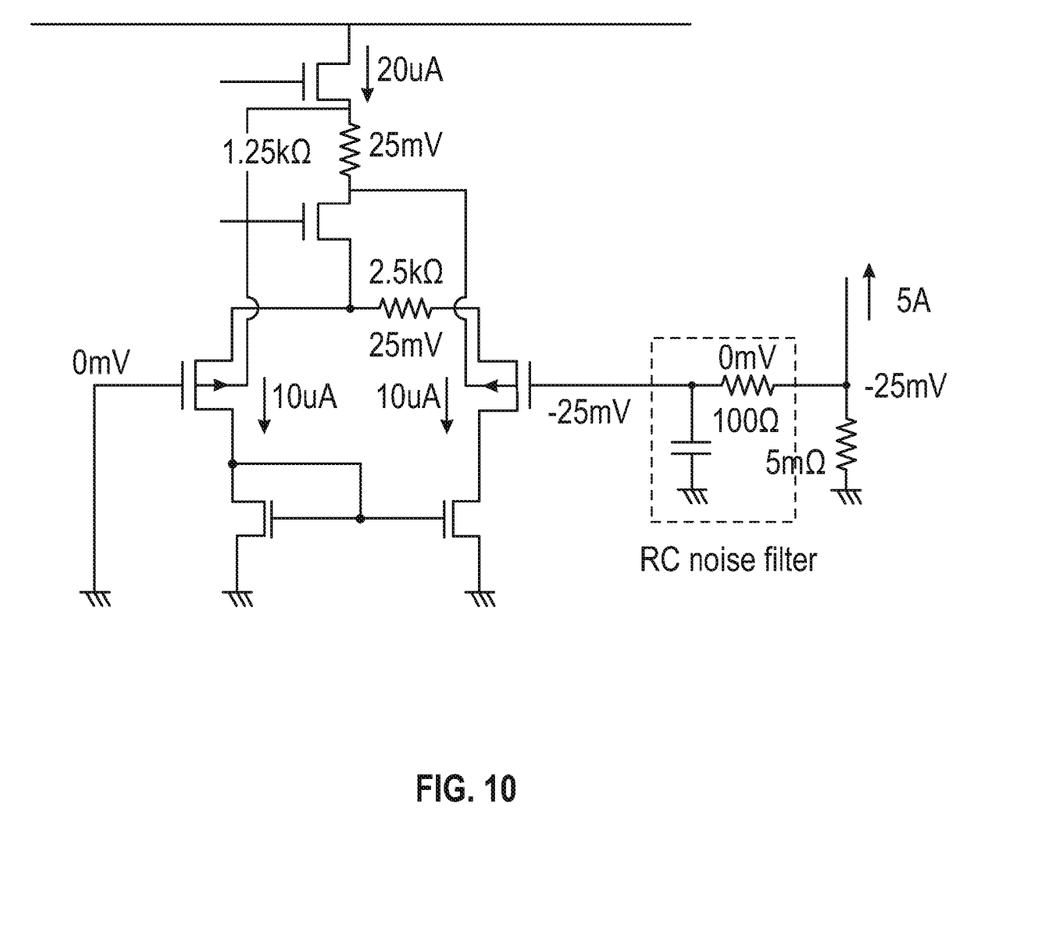
FIG. 10 illustrates a circuit diagram of an implementation of a comparator system having internal input offset voltage with a offset voltage across the resistor of the RC noise filter of 0 mV and a detected current of 5 A.

Referring to FIG. 10, a circuit diagram of an implementation of a comparator system having internal input offset voltage with a detected current of 5 amps is illustrated. In such implementations, the offset resistor between the cascodes allows the differential pair to successfully balance on the desired condition even when the RC noise filter is in place. This is because, as illustrated, the voltage drop across the resistor of the RC noise filter becomes 0 mV. In this case, the actual current through the resistor to which the RC noise filter is coupled correctly reads 5 A.

The system disclosed herein may be made of various materials such as silicon, silicon dioxide, tantalum, palladium, semiconductor materials, metals, plastics, alloys, composites, and the like.

In places where the description above refers to particular implementations of a comparator system having internal input offset voltage and implementing components, subcomponents, methods and sub-methods, it should be readily apparent that a number of modifications may be made without departing from the spirit thereof and that these implementations, implementing components, sub-components, methods and sub-methods may be applied to other comparator systems having internal input offset voltage.

What is claimed is:

1. A comparator system comprising:
   a first transistor comprising a gate, the gate configured to be coupled to a resistor-capacitor (RC) noise filter where the RC noise filter is coupled to a resistor, the first transistor comprised in a PMOS differential pair;
   a first offset resistor coupled to a source of the first transistor and to a source of a second transistor comprised in the PMOS differential pair; and
   a second offset resistor coupled between the first transistor and the second transistor;
   wherein a voltage difference between a first back gate bias voltage of the first transistor and a second back gate bias voltage of the second transistor indicates a current value through the resistor.

2. The system of claim 1, wherein the first offset resistor is configured to generate an input offset voltage.

3. The system of claim 2, wherein no current source is directly used to generate the input offset voltage.

4. The system of claim 1, further comprising four additional transistors operatively coupled together.

5. The system of claim 1, wherein there is no offset voltage resulting from the RC noise filter.

6. A comparator system comprising:
   a first transistor comprising a gate, the gate configured to be coupled to a resistor-capacitor (RC) noise filter where the RC noise filter is coupled to a resistor, the first transistor comprised in a PMOS differential pair;
   an NMOS current mirror coupled to the PMOS differential pair;
   a first offset resistor coupled to a source of the first transistor and to a source of a second transistor of the PMOS differential pair; and
   a second offset resistor coupled between the first transistor and the second transistor;
   wherein a voltage difference between a first back gate bias voltage of the first transistor and a second back gate bias voltage of the second transistor indicates a current value through the resistor.

7. The system of claim 6, wherein the first offset resistor is configured to generate an input offset voltage.

8. The system of claim 7, wherein no current source is directly used to generate the input offset voltage.

9. The system of claim 6, wherein there is no offset voltage resulting from the RC noise filter.

10. The system of claim 6, wherein the PMOS differential pair comprises a first cascode device, the first cascode device comprising a PMOS transistor.

* * * * *